(12) United States Patent (10) Patent No.: US 8,111,180 B2
Wiesbauer et al. (45) Date of Patent: Feb. 7, 2012

(54) ANALOG TO DIGITAL CONVERSION USING IRREGULAR SAMPLING

(75) Inventors: Andreas Wiesbauer, Portschach (AT); Lajos Gazsi, Dusseldorf (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 12/762,082

(22) Filed: Apr. 16, 2010

(65) Prior Publication Data

US 2010/0201558 A1 Aug. 12, 2010

Related U.S. Application Data

(63) Continuation of application No. 12/245,342, filed on Oct. 3, 2008, now Pat. No. 7,746,256.

(60) Provisional application No. 60/977,880, filed on Oct. 5, 2007.

(51) Int. Cl.
*H03M 3/00* (2006.01)
(52) U.S. Cl. ........................ 341/143; 341/155
(58) Field of Classification Search .................. 341/143, 341/159, 61; 375/206, 242, 371, 354; 455/135, 455/337, 130, 205, 214
See application file for complete search history.

(56) References Cited

U.S. PATENT DOCUMENTS

| | | | |
|---|---|---|---|
| 5,471,209 A | 11/1995 | Sutterlin et al. | |
| 5,838,272 A | 11/1998 | Steiner et al. | |
| 5,959,562 A | 9/1999 | Wiesbauer | |
| 6,008,703 A | 12/1999 | Perrott et al. | |
| 6,016,112 A | 1/2000 | Knudsen | |
| 6,087,968 A * | 7/2000 | Roza ............................ | 341/143 |
| 6,369,730 B1 | 4/2002 | Blanken et al. | |
| 6,414,613 B1 | 7/2002 | Midya et al. | |
| 6,741,197 B1 | 5/2004 | Melanson | |
| 6,839,387 B1 | 1/2005 | Mittel | |
| 7,006,762 B2 | 2/2006 | Baskin | |
| 7,123,101 B2 | 10/2006 | Puma et al. | |
| 7,298,310 B2 | 11/2007 | Tsividis | |
| 2003/0223488 A1 * | 12/2003 | Li et al. ......................... | 375/232 |

FOREIGN PATENT DOCUMENTS

| | | |
|---|---|---|
| DE | 4333908 A1 | 4/1995 |
| DE | 10233391 C1 | 12/2003 |
| EP | 1229641 A1 | 8/2002 |

OTHER PUBLICATIONS

Bresch et al, "TMS320C67-Based Design of a Digital Audio Power Amplifier Introducing Novel Feedback Strategy," Rose-Hulman Institute of Technology, Electrical and Computer Engineering Department, no date (available at least as early as Sep. 12, 2007), pp. 1-16.

Erickson, "A Fundamental Introduction to the Compact Disc Player," Department of Electrical Engineering, University of Minnesota, Nov. 29, 1994, pp. i-19.

Holme, "15-25 MHz Fractional-N Synthesizer," retrieved on Sep. 12, 2007 at <<http://www.holmea.demon.co.uk/Frac2/Mash.htm>>, 4 pgs.

Holme, "Fractional-N Frequency Synthesizer," retrieved on Sep. 12, 2007 at <<http://www.holmea.demon.co.uk/FracN/Simulate.htm>>, 4 pgs.

Lampton et al, "A high-speed wide dynamic range time-to-digital converter," Review of Scientific Instruments, vol. 65, No. 11, Nov. 1994, pp. 3577-3584.

Markus et al, "An Efficient Delta-Sigma Noise-Shaping Architecture for Wideband Applications," 4th International Conference on Advanced A/D and D/A Conversion Techniques and Their Applications & 7th European Workshop on ADC Modelling and Testing (ADDA-EWADC'2002), Prague, Jun. 26-28, 2002, pp. 35-38.

* cited by examiner

*Primary Examiner* — Joseph Lauture
(74) *Attorney, Agent, or Firm* — Lee & Hayes, PLLC

(57) ABSTRACT

This disclosure relates to analog to digital conversion using irregular sampling.

19 Claims, 12 Drawing Sheets

ANALOG TO DIGITAL CONVERSION USING IRREGULAR SAMPLING

RELATED APPLICATIONS

This application claims priority to and is a continuation of application Ser. No. 12/245,342, filed Oct. 3, 2008, which is incorporated herein by reference in its entirety. The present application and application Ser. No. 12/245,342 also claim priority under 35 U.S.C. §119(e) to U.S. Provisional Application No. 60/977,880, filed Oct. 5, 2007, the disclosure of which is incorporated by reference herein.

BACKGROUND

It is a goal of electronic designers to design circuits that utilize a low supply voltage and consume low power. This is the case for Analog to Digital Converters or ADC, and in particular, for sample and hold circuits used in analog to digital conversion which typically require very high sampling frequency to achieve good performance and accuracy. A high sampling frequency requirement typically results in high power consumption.

FIG. 1 is a prior art Analog to Digital Converter (ADC) 100 and a representative timing diagram 102. ADC 100 includes a traditional sample and hold circuit or SnH circuit 104. A pulse modulator 106 converts amplitude information of an input analog signal into time information by duty cycle modulation. The timing diagram 102 shows a pulse-modulated signal 108 which is generated by the pulse modulator 106, and received by the SnH circuit 104. The SnH circuit 104 samples the output of the pulse modulator 106 at discrete intervals of time (where the interval may be represented by $F_S$) using an equidistant sampling clock. The output of the SnH circuit 104 is represented as sampled modulated signal 110. Pulses generated by the equidistant sampling clock are represented by signal 112.

Equidistant sampling can result in a duty cycle modulated square wave 110 with synchronous leading and trailing edges, similar to the modulated signal 108. The difference between the edge positions of the modulated signal 108 and the sampled signal 110 is an introduced quantization noise as represented by signal 114.

Various known techniques may reduce the quantization noise depicted in signal 114. Such techniques include applying higher clock frequencies that use a polyphase sampler and polyphase filters instead of the SnH circuit 104. However, these techniques are usually complex, and inefficient in reducing the high sampling clock required for sampling the analog signal. Therefore, such known techniques still may require a high supply voltage, and consume relatively more power.

BRIEF DESCRIPTION OF THE DRAWINGS

The detailed description is described with reference to the accompanying figures. In the figures, the left-most digit(s) of a reference number identifies the figure in which the reference number first appears. The same numbers are used throughout the drawings to reference like features and components.

DETAILED DESCRIPTION

Discussed are techniques for signal processing for sampling and quantizing of amplitude and band limited signals. Such techniques can be implemented through an Asynchronous Delta-Sigma Modulator (ADSM) and Time to Digital Converter (TDC)/Irregular Sampler. The ADSM and TDC/Irregular Sampler can be implemented in a variety of electronic systems, such as, audio systems, TV tuner cards, etc. For example, the ADSM and TDC/Irregular Sampler can be implemented in Analog to Digital Converters (ADC) used in wireless communication systems, mobile communication systems, Direct Current to Direct Current (DC-DC) converters, microphones, etc.

Together, the ADSM and TDC/Irregular Sampler convert a continuous time analog signal into a discrete time digital signal. The TDC/Irregular Sampler may sample a continuous signal at discrete intervals of time to convert the continuous signal into a discrete signal. In particular, synchronous samples are not required and no clock signal is needed for sampling. This is performed while generating time-discrete irregular sample values, where sample by sample is taken without latency.

The disclosed irregular sampler and quantizer convert the input analog signal into a corresponding digital signal using time-discrete irregular sampling values of the input signal. The amplitude of the input signal may be first converted into time information of a square wave by a modulator. In an implementation, the time signal is digitized by the TDC/Irregular Sampler that samples the continuous time signal at non-equidistant discrete times and generates irregular sampling values. The sampling values can be quantized, and the original signal can then be reconstructed in digital form by a digital signal processor, such as a demodulator. In certain implementations, conversion of an irregular output (sampling) of the TDC/Irregular Sampler to an equidistant sampling may be performed by the DSP.

For example, the use of such techniques may be implemented in an Analog to Digital Converter (ADC) can lead to results that are more accurate and allow the ADC to function at a lower clock frequency, and thereby requiring relatively lower supply voltages and power consumption.

In an implementation, the ADC can be extended with a feedback loop for shaping the quantization noise of the ASDM and TDC/Irregular Sampler. This can provide a decrease in in-band distortion generated during the irregular sampling and can lead to greater accuracy. Quantization may be performed by the TDC/Irregular Sampler. In addition, noise shaping methods may be implemented, as well as oversampling to reduce or improve signal to noise ratio.

Figure 1:
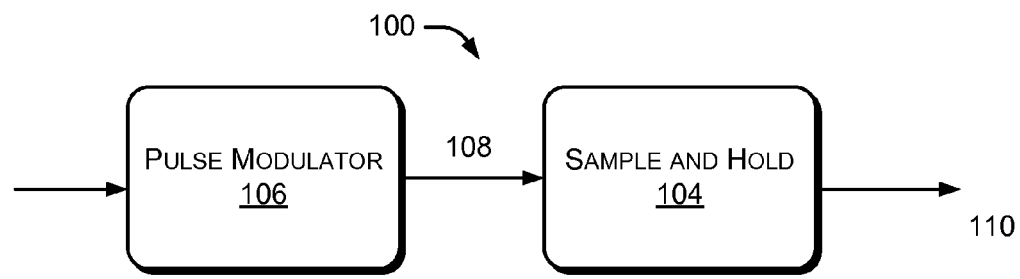
FIG. 1 illustrates a prior art Analog to Digital Converter and associated timing diagrams.
Figure 1:
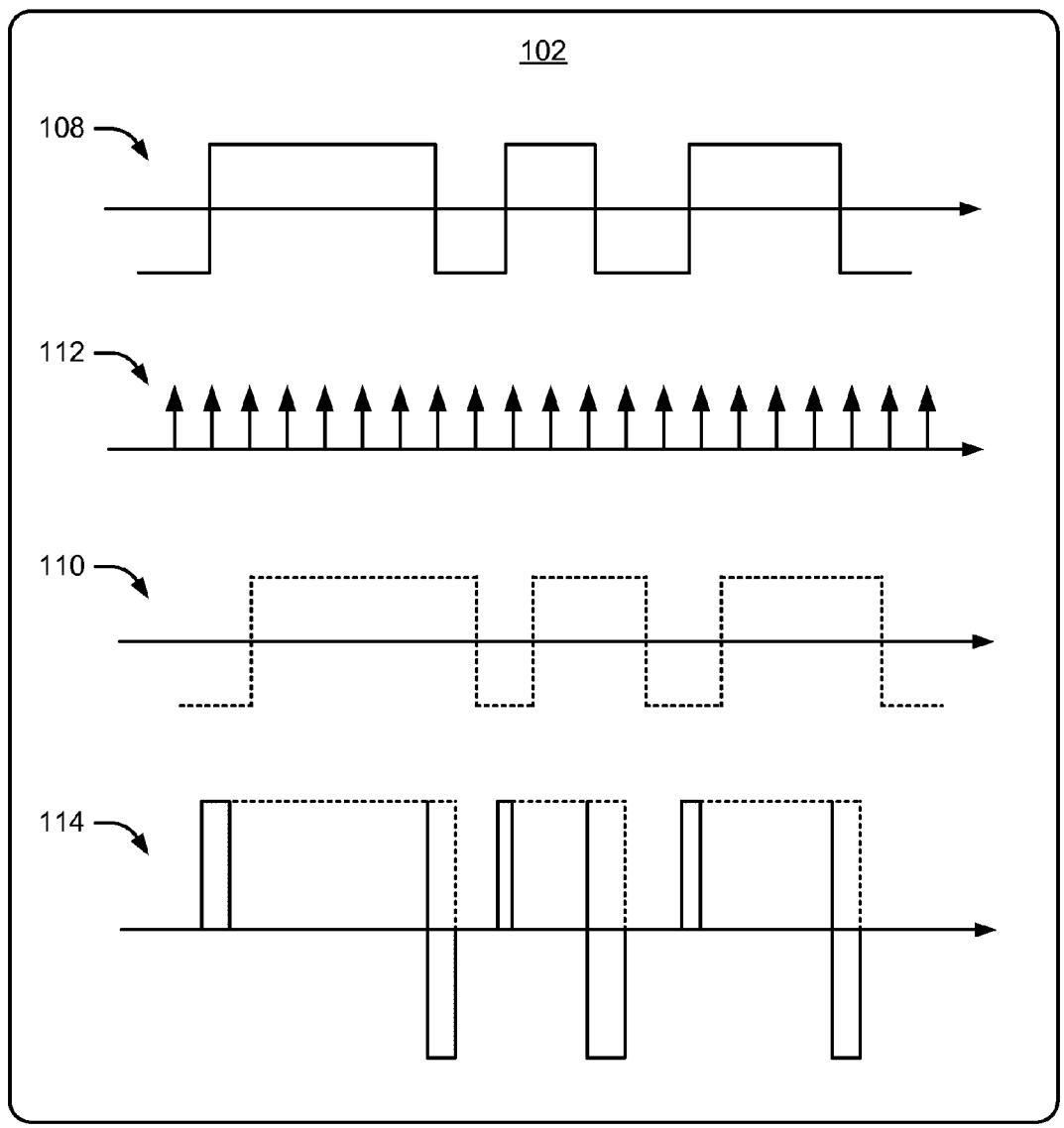
Figure 2:
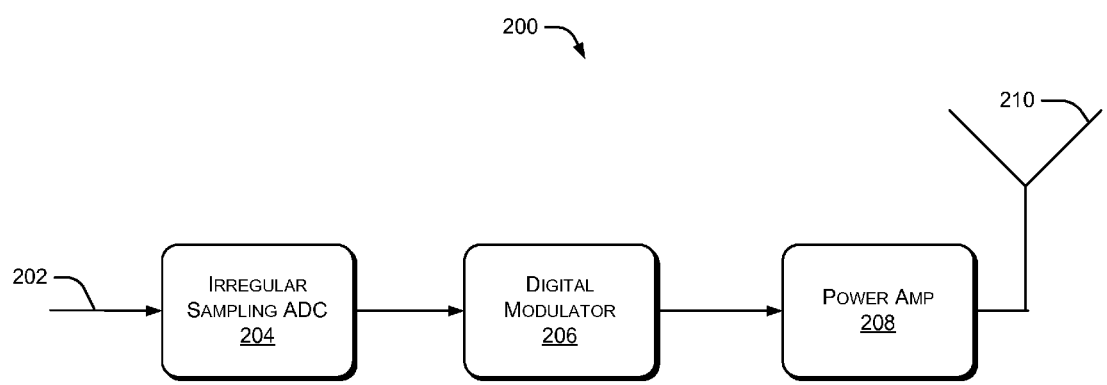
FIG. 2 illustrates an exemplary system for implementing an Analog to Digital Converter (ADC) using irregular sampling.

FIG. 2 is an exemplary system 200 that employs an ADSM and TDC/Irregular Sampler implemented in an Analog to Digital Converter. For example, the system 200 can be an apparatus or system such as a wireless communication system performing analog to digital conversion and transmitting a digital signal. It is to be understood, that the system 200 may also be implemented as, or part of another system such as a TV tuner card, mobile communications systems, Bluetooth transmission systems, Very high speed Digital Subscriber Line (VDSL) systems, and so on.

The system 200 receives analog input signals 202 from an analog source, and includes an irregular sampling ADC 204 and a digital modulator 206 to generate a modulated digital signal. The modulated signal can drive a power amplifier 208. System 200 includes an antenna 210 to transmit the power-amplified signal.

As an example, analog input signals 202 can include voice signals or data signals, and/or a combination of the two. In the case of a voice signal, the analog source can be a microphone. If the signal is a data signal, then the analog input signals 202 can be video transmission signals, and the like.

The irregular sampling ADC 204 converts the analog signal into a digital signal. The irregular sampling ADC 204 first modulates the analog signal by converting amplitude information of the analog signal into continuous time information of the modulated analog signal. The modulated analog signal may be sampled at irregular intervals by the irregular sampling ADC 204. The irregular samples can be quantized and demodulated to reconstruct the original signal in digital form. In a particular implementation, noise shaping can also be introduced in the irregular sampling ADC 204 to reduce quantization noise present in the reconstructed digital signal at in-band frequencies. Exemplary operations of the irregular sampling ADC 204 is described in further detail below.

The digital modulator 206 modulates the digital output of the irregular sampling ADC 204. The digital modulator 206 can up sample the frequency of the signal or introduce a carrier for broadband transmission. In cases where the system is utilized for base-band transmission, the digital modulator 206 may be eliminated. In certain implementations, the digital modulator 206 can include various signal-processing components, such as digital filters, up samplers, and noise shapers.

The power amplifier 208 amplifies and increases the power efficiency of the modulated signal received from the digital modulator 206. As an example, the power amplifier 208 can be a class C or D non-linear amplifier working in a saturated mode close to cut-off. The amplified signal from the power amplifier 208 can be transmitted via the antenna 210.

Figure 3A:
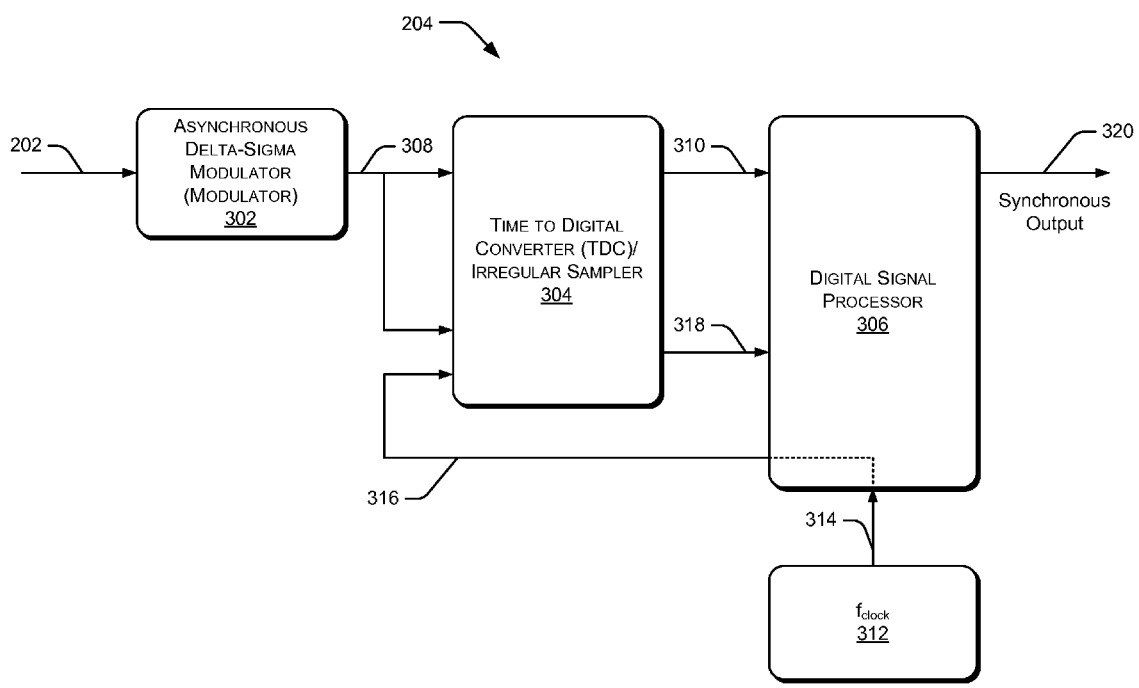
FIG. 3A illustrates an Analog to Digital Converter implementing an Asynchronous Delta-Sigma Modulator and Time to Digital Converter/Irregular Sampler.

FIG. 3A illustrates an exemplary irregular sampling ADC 204. The ADC 204 includes an Asynchronous Delta-Sigma Modulator or ADSM 302, a Time to Digital Converter/Irregular Sampler 304, and a Digital Signal Processor 306. The ADSM 302 can modulate the analog input signal 202. The ADSM 302 can convert the amplitude information of the analog input signal 202 into time information in time domain. Such modulation may commonly be referred to as pulse or duty cycle modulation. The ADSM 302 can generate a square wave with varying duty cycle in accordance with the amplitude of the analog input signal 202. For low amplitudes of the input analog signal 202, the duty cycle of the output square wave can be low and vice versa. The output signal is represented as signal 308, and is further illustrated in FIG. 4.

The ADSM 302 generates an asynchronous square wave with a duty cycle, which is approximately linearly dependent on the input analog signal 202. In addition, the ADSM 302 can generate an instantaneous frequency, which is non-linearly dependent on the input analog signal 202. The ADSM 302 can be implemented without any clock and can be operated at low currents and supply voltages. Further, since the ADSM 302 is asynchronous, the output signal 308 of the ADSM 302 does not include quantization error. The output signal 308 of the ADSM 302 is a direct representation of the input analog signal 202. An exemplary ADSM is further discussed in detail below in reference to FIG. 5.

The modulated signal from the ADSM 302 is sampled by the TDC/Irregular Sampler 304. The irregular sampler 304 digitally measures the edges of the modulated signal 308 (which is a square wave), and generates a sample each time a data transition edge in the square wave is detected. The output signal of the TDC/Irregular Sampler 304 is represented as signal 310.

The TDC/Irregular Sampler 304 samples the modulated signal 308 at irregular intervals. In the other words, the TDC/Irregular Sampler 304 samples or measures at non-equidistant sample values. To perform the sampling, no clock input is needed by the TDC/Irregular Sampler 304. In effect, the TDC/Irregular Sampler 304 operates as an ultra high-speed sampler that samples the input signal during data transition. Therefore, TDC/Irregular Sampler 304 can provide high precision sampling without a clock signal, which reduces activity of the TDC/Irregular Sampler 304 and reduces the power consumption.

Furthermore, the TDC/Irregular Sampler 304 may be used for quantization of the signal 308. The irregular sampler 304 can quantize the signal 308 into a signal 310 with discrete integer values or symbols. Any suitable number of binary bits can be employed to quantize the signal 308. For larger bit numbers, the number of levels that the sampled signal can be quantized into is larger. Therefore, the quantization noise is lower.

In certain implementations, a dither can be added to the TDC/Irregular Sampler 304 before quantization of the sampled modulated signal 308. Dither is an intentionally applied form of noise, used to randomize quantization error, thereby preventing large-scale patterns such as contouring. Dither can be added before any quantization or re-quantization process, in order to prevent non-linear behavior (i.e., distortion). The lesser the bit depth, the greater the dither can be. The results of the dithering process can still yield distortion; however, the distortion can be of a random nature, such that distortion can be effectively filtered. Examples of dithers that can be used include rectangle probability density function, triangular probability density function, Gaussian PDF, etc.

The TDC/Irregular Sampler 304 can be designed with digital components, such as inverters and latches, which work at higher speeds and consume lower amounts of power as compared to analog components. The irregular sampler 304 is further discussed in detail below.

A clock, $f_{clock}$ 312 may provide a clock signal 314 received by the TDC/Irregular Sampler 304. The $f_{clock}$ 312 may or may not be part of the ADC 204. In this example, the DSP 306 receives the clock signal 314 and passes the signal 316 to TDC/Irregular Sampler 304, where clock signal 314 is the same as clock signal 316. The clock signal 316 is further illustrated in FIG. 4. The clock signal 316 is particularly used for equidistant samples or regular sampling and may be used with a signal 308. In this example, signal 308 is split, such that irregular sampling may be performed independent of regular sampling. The clock signal 316 provides a "START" for the TDC/Irregular Sampler 304 to sample, either at a rising or falling edge of the clock signal 316, while the signal 308 can provide a "STOP" for the TDC/Irregular Sampler 304 to sample, either at the rising or falling edge of the signal 308.

An output of the TDC/Irregular Sampler 304 may be a sampled digital signal 318 measured at the edges of the modulated signal. The DSP 306 generates a digital representation of the analog input signal 202 from the sampled digital signal. The DSP 306 can construct a digital signal 320 (reconstructed digital signal) using a digital demodulation technique by transforming the time information received from the TDC/Irregular Sampler 304 back into amplitude information in digital form.

The DSP 306 can reconstruct the original signal in digital domain without ultra high-speed down sampling operations by demodulating the signal instead of filtering it. The demodulation is based on the general duty cycle modulation theory, and therefore can be used instead of an ultra-high speed down sampler, thereby increasing power efficiency. The demodulation technique used by the demodulator 306 is discussed in further detail below.

Figure 3B:
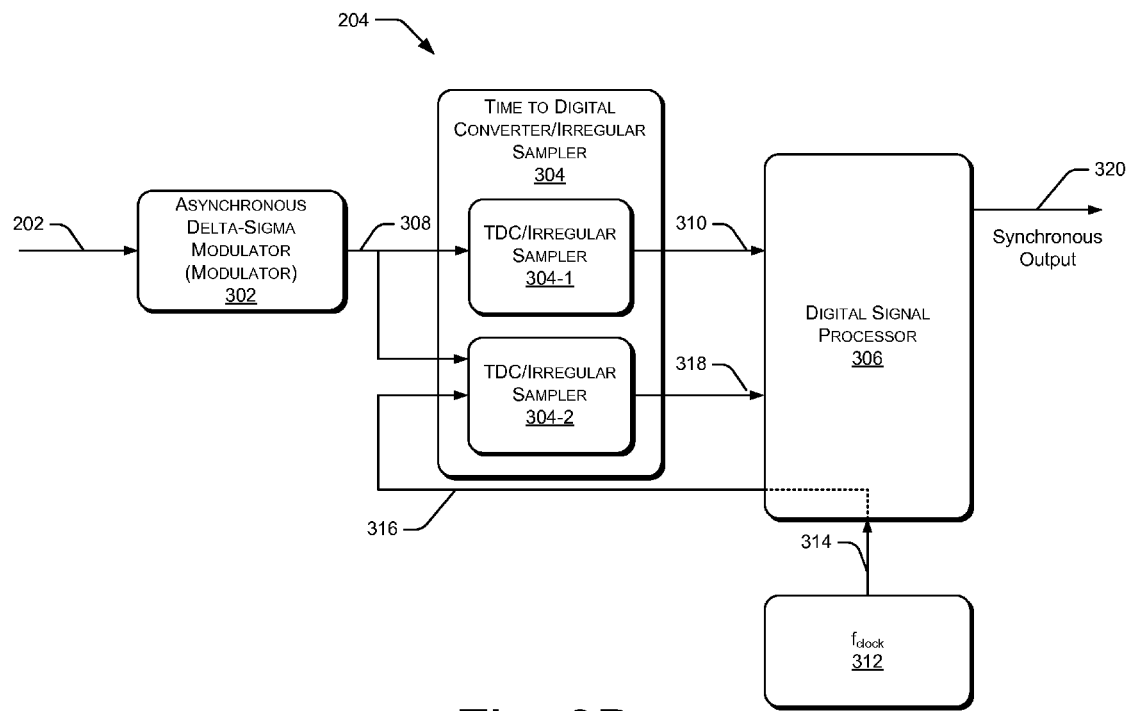
FIG. 3B illustrates an Asynchronous Delta-Sigma Modulator and Two Time to Digital Converters/Irregular Samplers.

FIG. 3B illustrates an alternate embodiment of the ADC 204. In this embodiment, the TDC/Irregular Sampler 306 includes two separate TDC/Irregular Samplers 306-1 and 306-2. In particular, TDC/Irregular Sampler 306-1 performs irregular sampling, receiving signal 308 and outputting signal 310. TDC/Irregular Sampler 306-2 performs regular sampling, receiving signal 308 and outputting signal 318.

Figure 4:
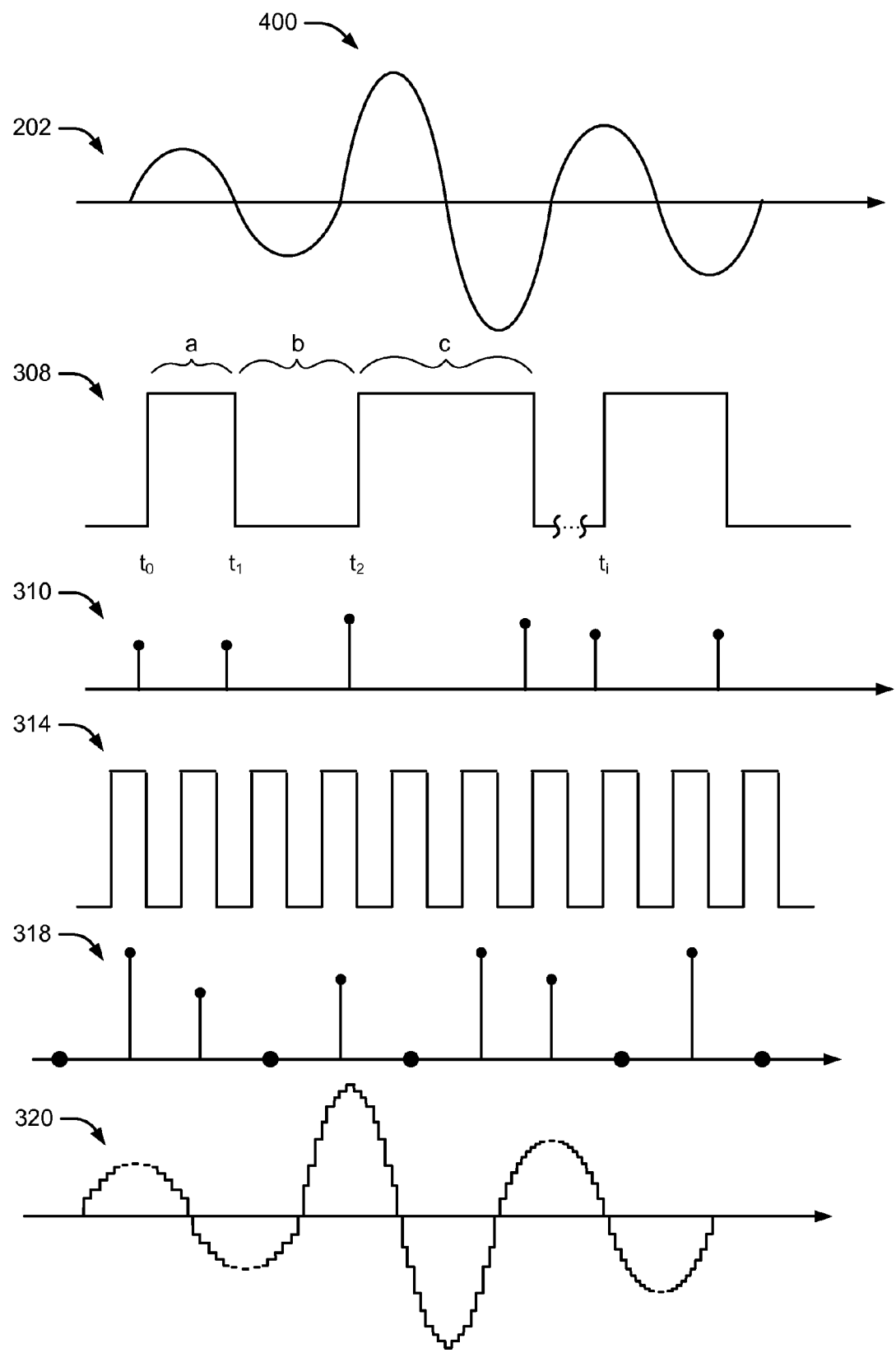
FIG. 4 illustrates a timing diagram of an Analog to Digital Converter used for implementing analog to digital conversion using irregular sampling.

FIG. 4 illustrates an exemplary timing diagram 400 of the ADC 204 illustrated in FIG. 3. The timing diagram 400 includes plots of the analog input signal 202, a modulated signal 308, an irregularly sampled signal 310, clock output 314 (also representative of clock signal 316) of the reference clock $f_{clock}$ 312, an equidistant sampled signal 318, and the reconstructed digital signal 320.

The input signal 202 in the timing diagram 400 is illustrated as a sinusoidal signal having multiple amplitudes. This input signal 202 is fed to the ADSM 302 and the output of the ADSM 302 is the modulated signal 308. As seen in the modulated signal 308, the pulses and duty cycle of the square wave vary in accordance with the amplitude of the analog input signal 202. For lower amplitude signals of the analog input signal 202, the modulated signal 308 has a smaller pulse width and lower duty cycle. In contrast, for higher amplitude signals of the analog input signal 202, the generated output pulse is wider and the modulated signal 308 can have a higher duty cycle.

The irregularly sampled signal 310 illustrates samples generated at the exact location of the data edges of the modulated signal 308. The samples are therefore irregular and not equidistant in time. In other words, whenever data edges are detected, samples are generated at that instant in time.

The irregular sampled output signal 310 may be represented by $[S_k; W_k(S_k)]$ where values are determined by the following equations.

$$S_k = \frac{t_{i+2} + t_i}{2} \quad (1)$$

$$W_k(S_k) = \frac{a-b}{a+b} \quad (2)$$

In an implementation, the TDC/Irregular Sampler 304 can also generate regular samples using the clock output 314 of the reference clock $f_{clock}$ 312. For regular sampling, both the rising and the falling data edges of the modulated signal 308 are measured relative to the rising clock edges of 314. For example, the $f_{clock}$ 312 can be set to 4 times the highest frequency of the input analog signal 202. The TDC/Irregular Sampler 304 can thus generate a regular equidistant sampled signal 318.

The irregularly sampled signal 310 or the equidistant sampled signal 318 may be received by the DSP 306, which creates the digital signal 308. The reconstructed digital signal 308 is a representation of the analog input signal 202 in digital form.

Asynchronous Delta Sigma Modulator

Figure 5:
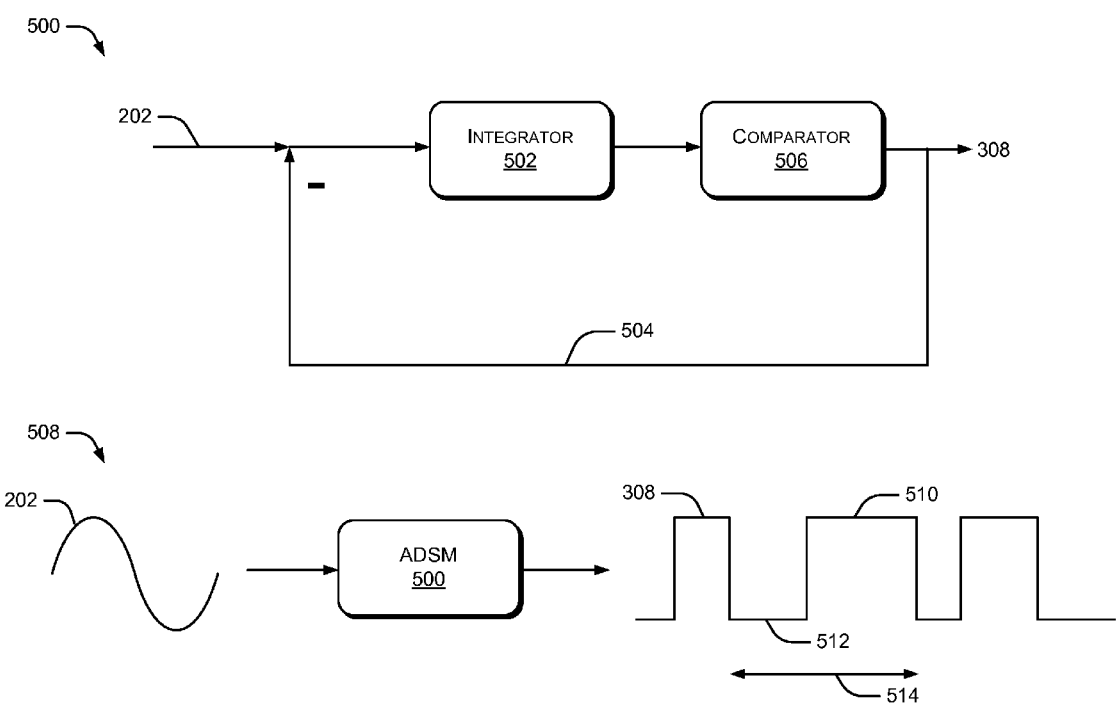
FIG. 5 illustrates an Asynchronous Delta-Sigma Modulator for implementing analog to digital conversion using irregular sampling.

FIG. 5 is an exemplary Asynchronous Delta Sigma Modulator (ADSM) 500. ADSM 500 may be an embodiment of ADSM 302.

The ADSM 500 modulates the signal 202 to a continuous time asynchronous square wave signal 308 through duty cycle modulation according to the following equations:

$$\frac{\alpha(t)}{T(t)} = \frac{v(t)+1}{2} \quad (3)$$

and $$\frac{\omega(t)}{\omega_c} = 1 - v^2(t) \quad (4)$$

with $\omega(t) = \frac{2\pi}{T(t)}$ and $|v(t)| < 1$ while, $\alpha(t) + \beta(t) = T(t)$.

Where $\alpha(t)$ is the pulse width, $\beta(t)$ is the pulse distance and $T(t)$ the pulse period and $\omega_c = 2\pi f_c$ is the limit or critical frequency. The duty cycle of the square wave can be $\alpha(t)/T(t)$. The limit frequency is the oscillation frequency of the square wave. The limit frequency is also the highest pulse rate of the square wave.

The ADSM 500 may include an integrator 502, a feedback signal 504, and a comparator 506. The integrator 502 generates a ramp voltage by integrating an input voltage signal over time. The output voltage of the integrator 502 increases continuously while the amplitude of the input analog signal 202 increases and then decreases abruptly as the amplitude of the signal 202 decreases.

In an implementation, the integrator 502 continuously integrates the difference between the input analog signal 202 and a feedback signal 504 received through the feedback loop. The output signal from the integrator 502 is received by the comparator 506. In general, a comparator, such as comparator 506, compares two input voltages or currents and switches its output to indicate which of the two inputs is larger. A comparator can also be used to refer to a device that compares two items of data. In this example, one of the voltages received by the comparator 506 can be a reference voltage. The ramp signal received from the integrator 502 can be compared with the reference voltage. The reference voltage can be a predefined value.

In one case, the output signal from the comparator 506 can switch from low to high if the integrator output rises above the reference voltage. In another case, the output signal from the comparator 506 can switch from high to low if the output from the integrator 502 drops below the reference voltage or remains unchanged. The output of the comparator 506 is a square wave, such as the modulated signal 308. The integrator 502 and the comparator 506 together convert the amplitude information of an input signal into time information.

The ADSM 500 can be of first order with the integrator 502 having unit gain frequency $f_{int}$ followed by the comparator 506 with hysteresis h. In such a case, the limit cycle frequency or $f_c$ may be defined as:

$$f_c = \frac{\pi}{2h} f_{int} \quad (5)$$

Linearity of the ADSM 500 depends on both the limit cycle frequency $f_c$ and Modulation Depth or MD. In general, the strength of the modulation is called the Modulation Depth or MD. Modulation Depth indicates how much the modulated variable varies about its original value. If the information in the input analog signal 202 is encoded without any losses in the transition timings of the output of the comparator 506, the ADSM 500 may require no over sampling. In other cases, over sampling can be introduced to increase the signal to noise ratio (SNR). For example, in one case, upon doubling the value of the limit cycle frequency of the ADSM, an improvement of −12.04 dB can be obtained.

The conversion of the analog input signal 202 into the modulated signal 308 by the ADSM 500 is depicted in the graphical representation 508. The output of the ADSM 500 is the modulated signal 308 with variations in pulse width ($\alpha(t)$) 510, pulse distance ($\beta(t)$) 512 and pulse period ($T(t)$) 514. These variations are generated in accordance with the amplitude of the input signal 202. The output signal 308 of the ADSM 500 is thus discrete in amplitude but continuous in time.

Time to Digital Converter

As discussed above, the TDC/Irregular Sampler 304 can include a Time to Digital Converter (TDC). Typically, TDCs are implemented in applications that use a single time measurement of one of several parallel pulses with a common start position, but with variable lengths. The time measurement can be done by sampling the input with multiple phases of a reference clock followed by an edge detector that can determine which phase passes closest to the data edge. Often, the resolution of the measurement can further be refined by using an interpolator. Fine resolutions in the order of tens of picoseconds can be obtained with low clock frequencies.

However, the TDC/Irregular Sampler 304 measures a continuous stream of short pulses at a high rate. Towards this end, the TDC/Irregular Sampler 304 uses a clock signal 314 (clock signal 316) of $f_{clock}$ 312 at a frequency that is at least equal to the limit cycle frequency of the modulated signal 308. The samples generated are irregular and indicate the exact location of data transition in the modulated signal 308.

In an implementation, the TDC/Irregular Sampler 304 can sample the modulated continuous time signal 308 as well as quantize the sampled signal 310. For this, the TDC/Irregular Sampler 304 approximates the sampled signal 310 based on discrete values to generate a quantized signal that can be converted into a digital signal 320.

Demodulation

Once the TDC/Irregular Sampler 304 samples and quantizes the modulated signal 308, the operations that follow may be purely digital. The output 310 of the TDC/Irregular Sampler 304 provides information regarding the original input signal 202 in the measured edge positions of the square wave. The input signal 202 can be reconstructed in the digital domain by the DSP 306. The DSP 306 can include a demodulator.

The demodulation equation can be represented as follows:

$$v(t) = 2\frac{\alpha(t)}{T(t)} - 1 = \frac{\alpha(t) - \beta(t)}{\alpha(t) + \beta(t)} \quad (6)$$

Using the measurements obtained by the TDC/Irregular Sampler 304, the above equation can be approximated by:

$$\hat{v}[n] = \frac{\hat{\alpha}(n) - \hat{\beta}(n)}{\hat{\alpha}(n) + \hat{\beta}(n)} \quad (7)$$

Where $\alpha[n]$, $\beta[n]$ and $v[n]$ are estimates of $\alpha[nT_s]$, $\beta[nT_s]$ and $v[nT_s]$, with $f_c \geq f_s = 1/T_s \geq 2B$. In addition, $\alpha[n]$ and $\beta[n]$ can be measured values from the output of the TDC, (i.e., the sampled signal 310).

The sampled signal 310 represents location of data edges, which are not synchronous with the $f_{clock}$ 312 but are located at a variable time before the rising edge of the clock. Reconstructing $\alpha$ and $\beta$ directly from the sampled signal 310 provides estimates for $\alpha(t_\alpha)$ and $\beta(t_\beta)$, where $t_\alpha$ and $t_\beta$ are the actual positions of $\alpha$ and $\beta$, instead of the estimates for $\alpha[nT_s]$ and $\beta[nT_s]$. To obtain the estimates for $\alpha[n]$ and $\beta[n]$ for the reconstruction, the calculated values for $\alpha$ and $\beta$ via the sampled signal 404 are interpolated to $nT_s$ using cubic spline interpolation. Cubic spline interpolation is a form of interpolation well known in the art, where interpolants are special types of piecewise polynomials called splines. The interpolation error can be very small with cubic interpolators.

Figure 6:
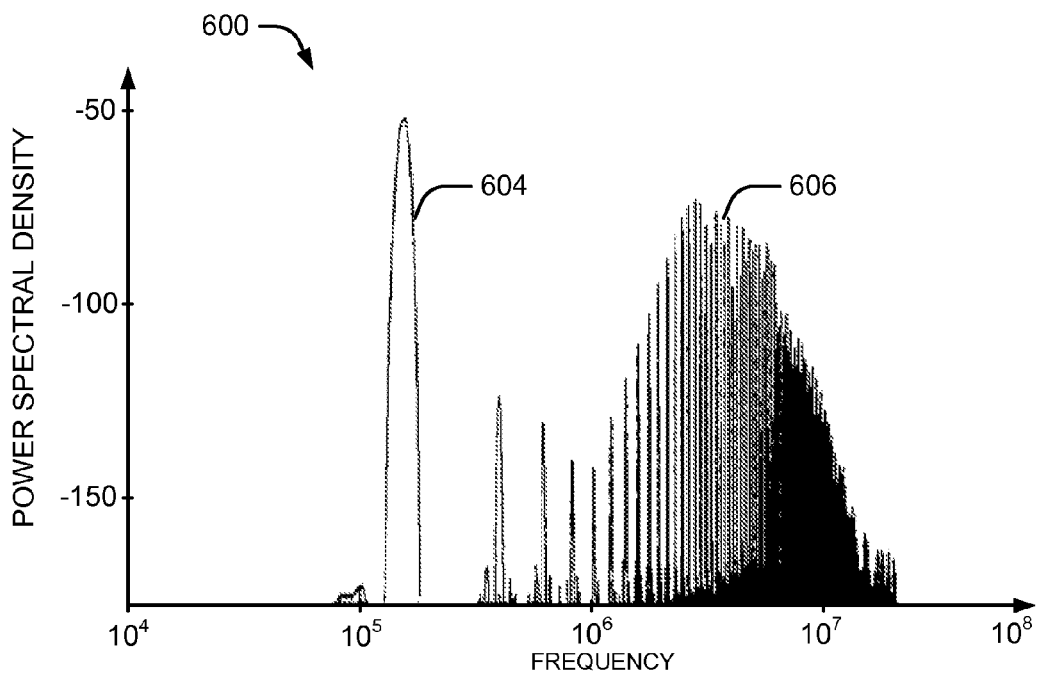
FIG. 6 illustrates power spectral density plots of an Asynchronous Delta Sigma Modulator (ADSM) and Time to Digital Converter (TDC) for an implementation of the ADSM and the TDC.
Figure 6:
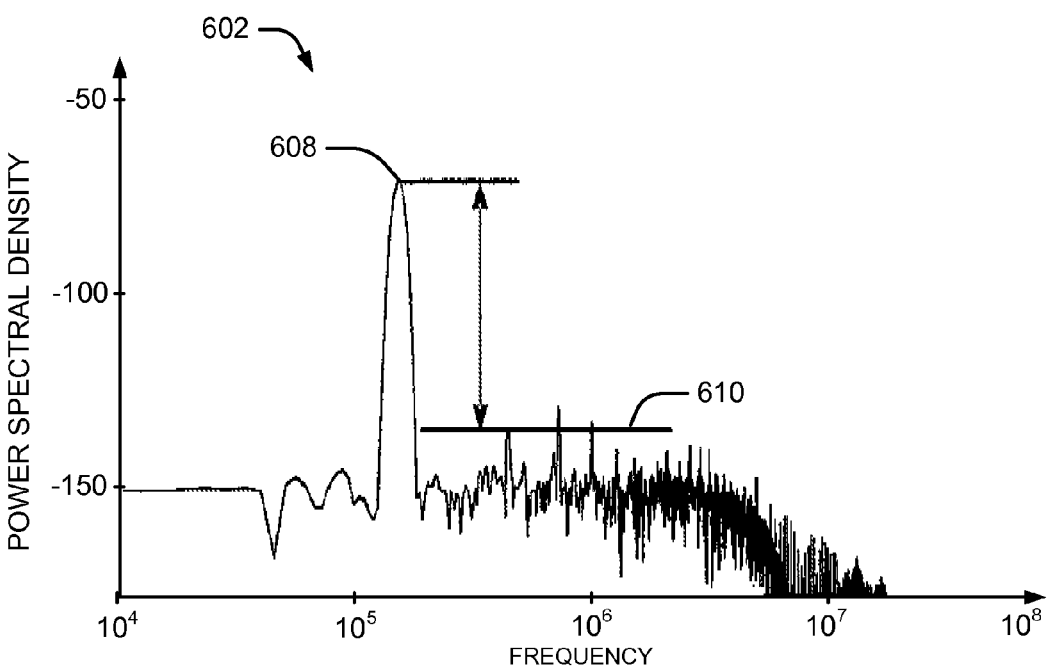

FIG. 6 illustrates exemplary Power Spectrum Density (PSD) plots 600 and 602 of the output of the ADSM 500 and the TDC/Irregular Sampler 304. In this example, the exemplary PSD plots 600 and 602 correspond to a 13 bit ADC with a signal bandwidth of 500 KHz, such as that used in typical Bluetooth baseband signals.

The PSD plot 600 of the ADSM 500 is depicted for a first order ADSM 500 including one integrator 502 and one comparator 506. The input signal can be a sine wave with a frequency of one-third the bandwidth. In this example, the modulation depth of the signal is 0.8. The PSD plot 600 of the ADSM 500 shows a fundamental signal 604 and the noise signal 606 that correspond to the modulated signal 308. The fundamental signal 604 is sufficiently separated from the noise signal 606 and has no quantization errors. This allows the use a low pass filter to remove the unwanted noise signal 606 and harmonic signals from the modulated signal 308.

The PSD plot 602 of the TDC/Irregular Sampler 304 implemented as a TDC shows a fundamental signal 608 and a noise floor 610. The quality of the TDC/Irregular Sampler 304 can be measured by its spurious-free dynamic range (SFDR) and signal to noise and distortion ratio (SNDR), which depend on separation between the fundamental signal 608 and the noise floor 610.

The SFDR is the usable dynamic range before spurious noise interferes or distorts the fundamental signal. SFDR is the measure of the difference in amplitudes between the fundamental signal and the largest harmonically or non-harmonically related spur from DC to full bandwidth. SFDR for any fundamental signal should be as large as possible so that the noise signal does not interfere with the useful signal too much. The following equation defines a proportional approximation of SFDR, where MD is modulation depth:

$$SFDR \propto \frac{F^2}{MD^2} \qquad (8)$$

With $F=f_c/B$ defined as the ratio between $f_c$ and the signal bandwidth B. Therefore, as the signal bandwidth B and the modulation depth increases, the SFDR decreases, and the SFDR increases, with an increase in the limit cycle frequency $f_c$.

The signal to noise and distortion ratio SNDR of the TDC is defined by the following equation:

$$SNDR \propto \frac{MD^2}{FB^2 t_{unit}^2} \qquad (9)$$

Where $t_{unit}=1/F_{ref}$. Therefore, for a given resolution and bandwidth, the SNDR decreases as the limit cycle frequency $f_c$ increases. In contrast, increasing the modulation depth increases the SNDR.

In an implementation, the modulation depth is limited to about 0.8, which can maximize the SNDR. In addition, the smaller $t_{unit}$ is, the larger the SNDR will be for the TDC. From the plot 602, it can be seen that the SNDR in the 0-500 KHz band (i.e., the in-band) is approximately 80 dB, while the SFDR in the in-band for the TDC output signal is approximately 80 dB as well. For example, a Bluetooth system may require a SNDR of at least 78 dB. Therefore, the TDC/Irregular Sampler 304 implemented as a TDC can be used in ultra-low voltage technologies such as a Bluetooth system.

Irregular Sampling with Noise Shaping

As described above, an irregular sampler can perform quantization of the sampled signal also. During quantization, the irregular sampler can introduce quantization noise into the circuit due to its finite precision. At high limit cycle frequencies, this can result in reduced SNDR of the system. To increase the SNDR of the system, noise-shaping techniques can be applied. For this, a feedback loop is introduced into the system, which shapes the quantization noise of the irregular sampler and quantizer to higher frequencies.

Noise shaping is a bit reduction technique that can be used to minimize the quantization error. Noise shaping puts the quantization error in a feedback loop. Any feedback loop functions as a filter. Therefore, by creating a feedback loop for the error itself, the error can be filtered as desired.

During noise shaping, when any samples bit-depth is reduced, the quantization error between the rounded value and the original value is measured and stored. The error value is then added to the next sample prior to the quantization. The effect here is that the quantization error itself is put into the feedback loop. The cut-off frequency of the filter can be controlled by the amount of the error from the previous sample that is fed back.

Without noise shaping, the SNDR of the system can be reduced by about 10 dB/decade of F according to the equation:

$$SNDR \propto \frac{MD^2}{FB^2 t_{unit}^2} \qquad (9)$$

However, noise shaping can increase the SNDR by 20 dB/decade with N (the order of the noise-shaping filter). Thus, for a system with $N^{th}$ order noise shaping, the SNDR can be defined by the following equation:

$$SNDR \propto \frac{MD^2 F^{2N-1}}{B^2 t_{unit}^2} \qquad (10)$$

While a system without noise shaping can perform better when a low limit cycle frequency is chosen, a system with noise shaping benefits more from the increased performance when the limit cycle is high.

Figure 7:
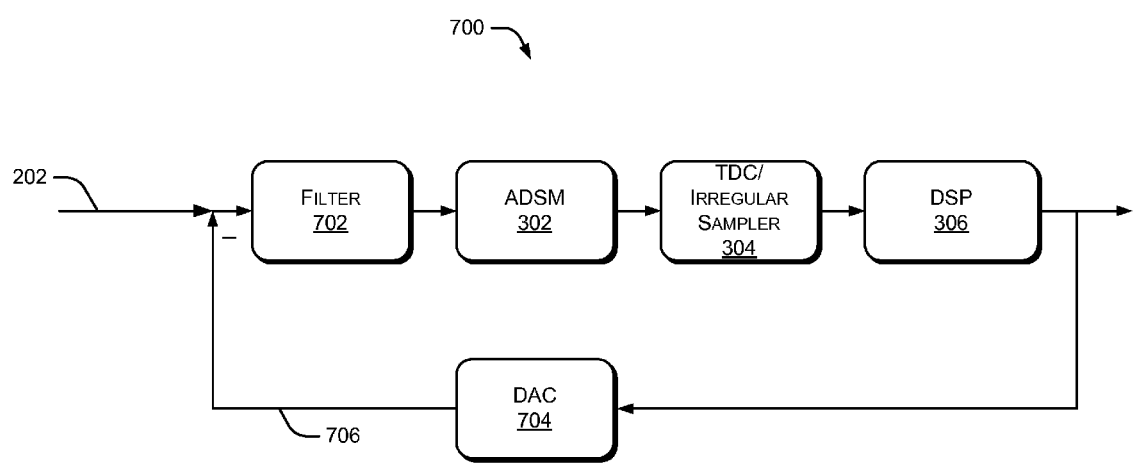
FIG. 7 illustrates an Analog to Digital Converter using irregular sampling with noise shaping.

FIG. 7 illustrates an exemplary irregular sampling analog to digital converter (ADC) with noise shaping 700 or ADC 700. It will be appreciated that the irregular sampling ADC with noise shaping 700 can be a part of a larger electronic device. In this example, the ADC 700 includes a digital filter 702, ADSM 302, TDC/Irregular Sampler 304, DSP 306, and a digital to analog converter or DAC 704 in a feedback loop.

An $N^{th}$ order noise-shaping filter 702 filters a signal obtained by combining the input signal 202 and a feedback signal 706. The digital filter 702 can be of any suitable order N, such as a second order noise shaper, a third order noise shaper, and so on. The digital filter 702 band limits the signal, and shapes the noise to a higher frequency, outside the bandwidth of the useful fundamental signal.

The output of the digital filter 702 is received by the modulator 302. In one implementation, the ADSM 302 converts the amplitude information of the analog signal into time information of the output asynchronous square wave signal.

This modulated signal from ADSM 302 is received by TDC/Irregular Sampler 304. In an implementation, the TDC/Irregular Sampler 304 generates time discrete irregular samples of the modulated signal. The TDC can over sample or hyper-sample the modulated signal in order to increase the SNDR and reduce the error. In another embodiment, the TDC/Irregular Sampler 304 can generate regular or equidistant samples by introducing a reference clock in the TDC circuitry.

In another implementation, the irregular samples generated by the TDC/Irregular Sampler 304 can be quantized into discrete levels. As discussed above, dithering can be introduced into the ADC 700 before quantization to reduce the distortion error and quantization error that can be introduced by the quantization process.

The irregular sampled and quantized output of the TDC/Irregular Sampler 304 is fed to the DSP 306. In an implementation, the DSP 306 includes a demodulator. The DSP 306 reconstructs the original signal. A part of this digital reconstruction of the original signal is converted to the analog feedback signal 706 with multi-bit digital to analog converter (DAC) 704.

The DAC 704 introduced in the feed back circuit can be any suitable multi-bit DAC. The higher the number of bits of the DAC 704, the more precise it would be. Examples of DAC 704 can include pulse width modulation DAC, over sampling DAC, binary weighted DAC, segmented DAC and, so on.

Figure 8:
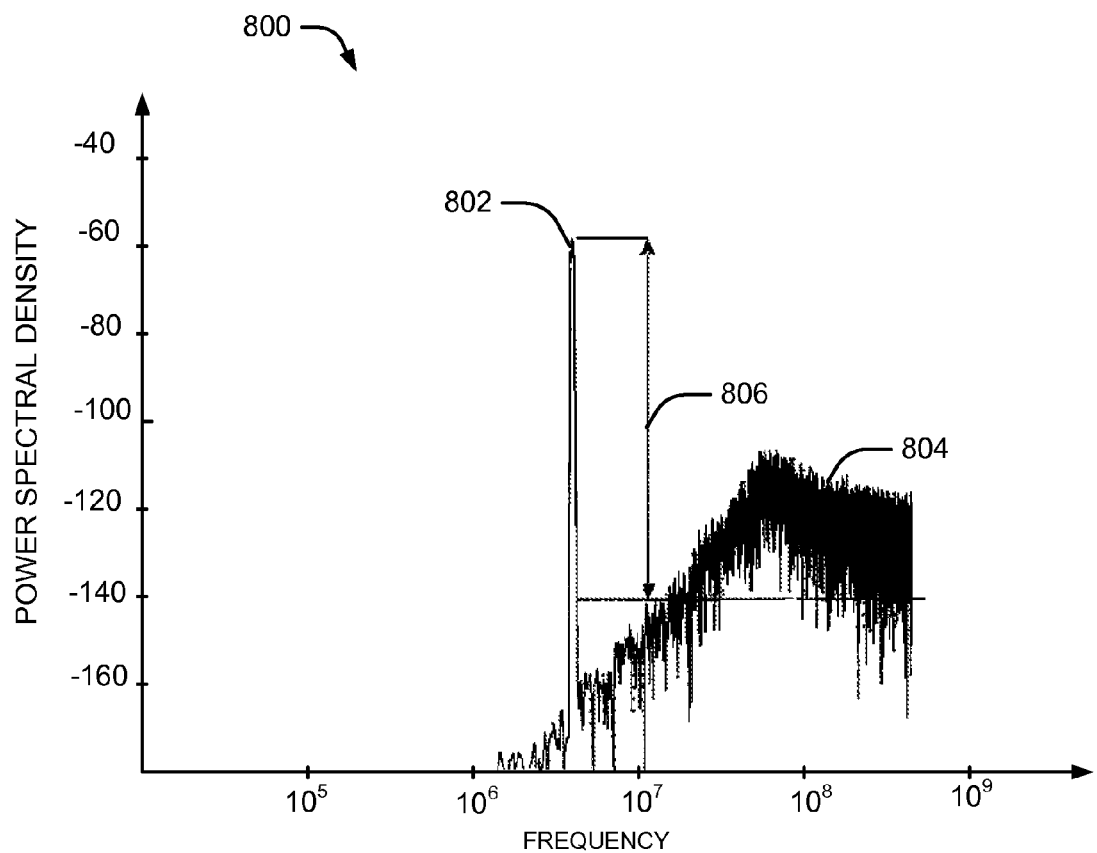
FIG. 8 illustrates a power spectral density plot of an Analog to Digital Converter (ADC) using a Time to Digital Converter (TDC) with noise shaping for an implementation of the ADC.

FIG. 8 is an exemplary PSD plot 800 of the output of the ADC 700 with second order noise shaping. In this example, the PSD is plotted for an ADC 700 system with a bandwidth requirement of 12 MHz, suitable for Very High Speed Digital Subscriber Line (VDSL). A first order feedback is used to shape the quantization noise of the TDC. The time resolution may be 10 picoseconds (ps) and the modulation depth may be 0.5. For this configuration, 12 bit accuracy is obtained over the 12 MHz bandwidth with a limit cycle frequency of 750 MHz.

The PSD plot 800 shows a fundamental signal 802 and quantization noise 804. The quantization noise 804 has been shifted to higher frequencies by noise shaping as depicted in the plot 800. The difference between the fundamental signal amplitude and the noise amplitude is approximately 72 dB, which is the SNDR. The SFDR 806 of the depicted system is approximately 82 dB.

Exemplary Methods

Figure 9:
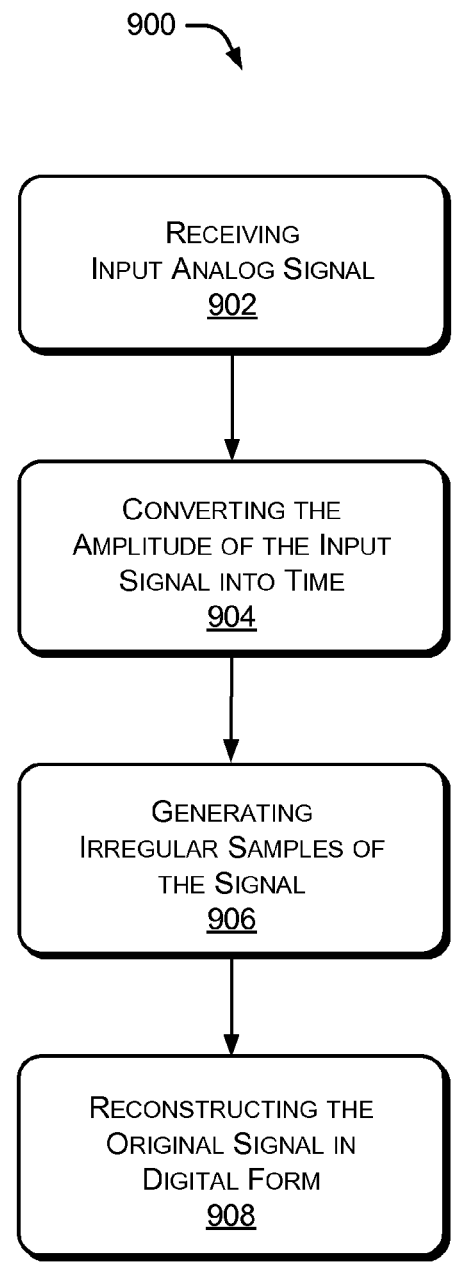
FIG. 9 illustrates a flow diagram for implementing analog to digital conversion using irregular sampling.

FIG. 9 illustrates an exemplary method 900 for implementing analog to digital conversion using irregular sampling and is described with reference to FIGS. 2-6. The order in which the method 900 is described is not intended to be construed as a limitation, and any number of the described method blocks can be combined in any order to implement the method 900, or an alternate method. Additionally, individual blocks may be deleted from the method 900 without departing from the spirit and scope of the subject matter described herein. Furthermore, the method 900 can be implemented in any suitable hardware, software, firmware, or a combination thereof, without departing from the scope of the subject matter described herein.

At block 902, an input analog signal is received. As discussed above, an example of such an input analog signal is the analog input signal 202 which may be received by the ADSM 302. The received analog input signal may be a band-limited signal. In an implementation, if the signal is not band limited, pre-filtering can band limit the signal and minimize interference noise in the analog signal. Furthermore, the input analog signal may be amplified, if the signal is weak, before further processing.

At block 904, amplitude to the received band limited analog input signal is converted to time. The received band limited analog input signal is modulated. For example, band limited analog input signal 202, may be modulated using ADSM 302. In an implementation, the ADSM 302 can be the ADSM 500. The ADSM 500 can convert the amplitude information of the analog input signal 202 into time information of the modulated signal 308 using duty cycle modulation or pulse modulation. As a result, variations in the amplitude of the analog input signal 202 are converted into variations of the pulse width 510 and pulse period 514 of the modulated signal 308. The output of the modulator 302 can be an asynchronous time continuous square wave.

At block 906, irregular samples of the modulated signal are generated. For example, irregular samples of modulated signal 308 can be generated. In an implementation, a TDC/Irregular Sampler 304 can be used for sampling the modulated signal 308. The TDC/Irregular Sampler 304 measures the location of data edges of the modulated signal 308 and produces an irregular sampled output 310 indicating the location of the data edges of the modulated signal 306.

In addition, the TDC/Irregular Sampler 304 can also generate an equidistant sampled signal 318 by sampling the signal at regular intervals of time. This can be achieved by introducing a reference clock $f_{clock}$ 314 in the TDC/Irregular Sampler 304 that measures the variation in data edges at regular intervals of time.

In certain cases, the irregularly sampled signal 310 can be quantized by the TDC/Irregular Sampler 304. The quantization of the samples can introduce a quantization error due to the finite precision of the TDC/Irregular Sampler 304. Dithering may be introduced before the quantization of the sampled signal to randomize the quantization noise. Examples of dithers that can be used include rectangle probability density function, triangular probability density function, Gaussian PDF, etc.

At block 908, the original signal can be reconstructed in digital form to generate a digital signal. An example of the digital signal is digital signal 308 as described above. A digital signal processor (DSP) or demodulator (e.g., DSP 306) can be used to reconstruct the signal sample by sample. The DSP may use techniques derived from duty-cycle modulation theory as described above, which can allow reconstruction of the original signal without ultra high-speed operations.

Figure 10:
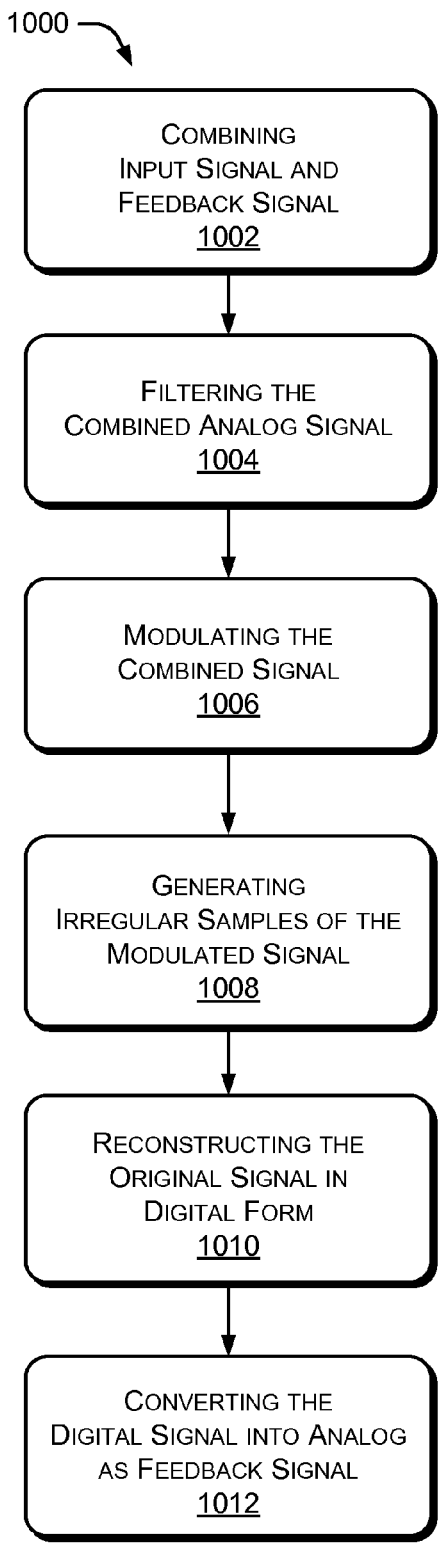
FIG. 10 illustrates a flow diagram for implementing analog to digital conversion using irregular sampling with noise shaping.

FIG. 10 illustrates an exemplary method 1000 for analog to digital conversion using irregular sampling with noise shaping and is described with reference to FIGS. 7-8. The order in which the method 1000 is described is not intended to be construed as a limitation, and any number of the described method blocks can be combined in any order to implement the method 1000, or an alternate method. Additionally, individual blocks may be deleted from the method 1000 without departing from the spirit and scope of the subject matter described herein. Furthermore, the method 1000 can be implemented in any suitable hardware, software, firmware, or a combination thereof, without departing from the scope of the subject matter described herein.

At block 1002, an input analog signal is combined with a feedback signal and is sent to a digital filter. For example, the input analog signal 202 is combined with feedback signal 704 and sent to digital filter 702. The input analog signal may be band limited. In cases where the analog input signal is not band limited, a pre-filtering low pass filter can be introduced to limit the analog input signal and remove higher harmonics and noise. A feedback signal (e.g., feedback signal 706) may be obtained from a reconstructed digital signal (e.g., digital signal 320) that can include quantization noise.

At block 1004, the combined signal is filtered. The filtering may be performed using a digital noise-shaping filter (e.g., digital noise-shaping filter 702). The quantization noise can be shaped to a higher frequency part of the spectrum so that the quantization does not interfere with the fundamental input signal (e.g., analog input signal 202). The noise-shaping filter can be of any suitable order such as first order noise shaper, second order noise shaper, and so on.

At block 1006, the combined noise shaped signal can be modulated. For example, the combined noise shaped signal may be modulated by the ADSM 302. In an implementation, the ADSM 500 can be used to modulate the signal. In such implementations, the ADSM 500 converts the amplitude information of the combined signal into time information of the modulated signal. The ADSM 500 uses pulse modulation to obtain an output that varies in pulse width and pulse period in accordance with the variation of the amplitude of the combined signal.

At block 1008, samples of the combined modulated signal are generated. In particular, the combined modulated signal is sampled irregularly to obtain non-equidistant samples. In an implementation, the irregular sampler 304 can sample the combined modulated signal irregularly to obtain the non-equidistant samples. A TDC can also be used to sample the signal. The TDC samples the signal whenever there is a data transition. The edges of the modulated signal are digitally measured and the TDC generates a digital sampled signal (e.g., signal 310) that represents the location of the data edges of the modulated signal (e.g., signal 308).

Furthermore, the TDC can generate equidistant or regular samples by sampling the modulated signal at regular intervals of time. The TDC can include a reference clock that functions at least at the limit cycle frequency to avoid losing any information. The reference clock can function at a frequency much higher than the limit frequency, which would over sample or hyper-sample the modulated signal thereby increasing the SNDR of the TDC.

In addition, the sampled signal 310 can also be quantized by the TDC. The quantized signal can introduce a quantization error into the quantized signal as the TDC operates at a finite resolution. The quantization error can be lowered by increasing the resolution of the TDC. Dithering can be introduced before the quantization to randomize the quantization noise.

At block 1010, the sampled and quantized signal can be used to reconstruct the original signal in digital form. The reconstruction is carried out sample by sample and can be performed at a reasonable clock frequency. In an implementation, the DSP 306 can be used to reconstruct the original signal using the duty-cycle modulation theory as discussed above.

At block 1012, a part of the reconstructed digital signal is converted back into an analog signal. The converting may be performed by a digital to analog converter (e.g., DAC 706). The converted signal may used as a feedback signal (e.g., feedback signal 706), in order to shape the quantization noise introduced by the TDC/Irregular Sampler 304.

Exemplary Electronic Device

Figure 11:
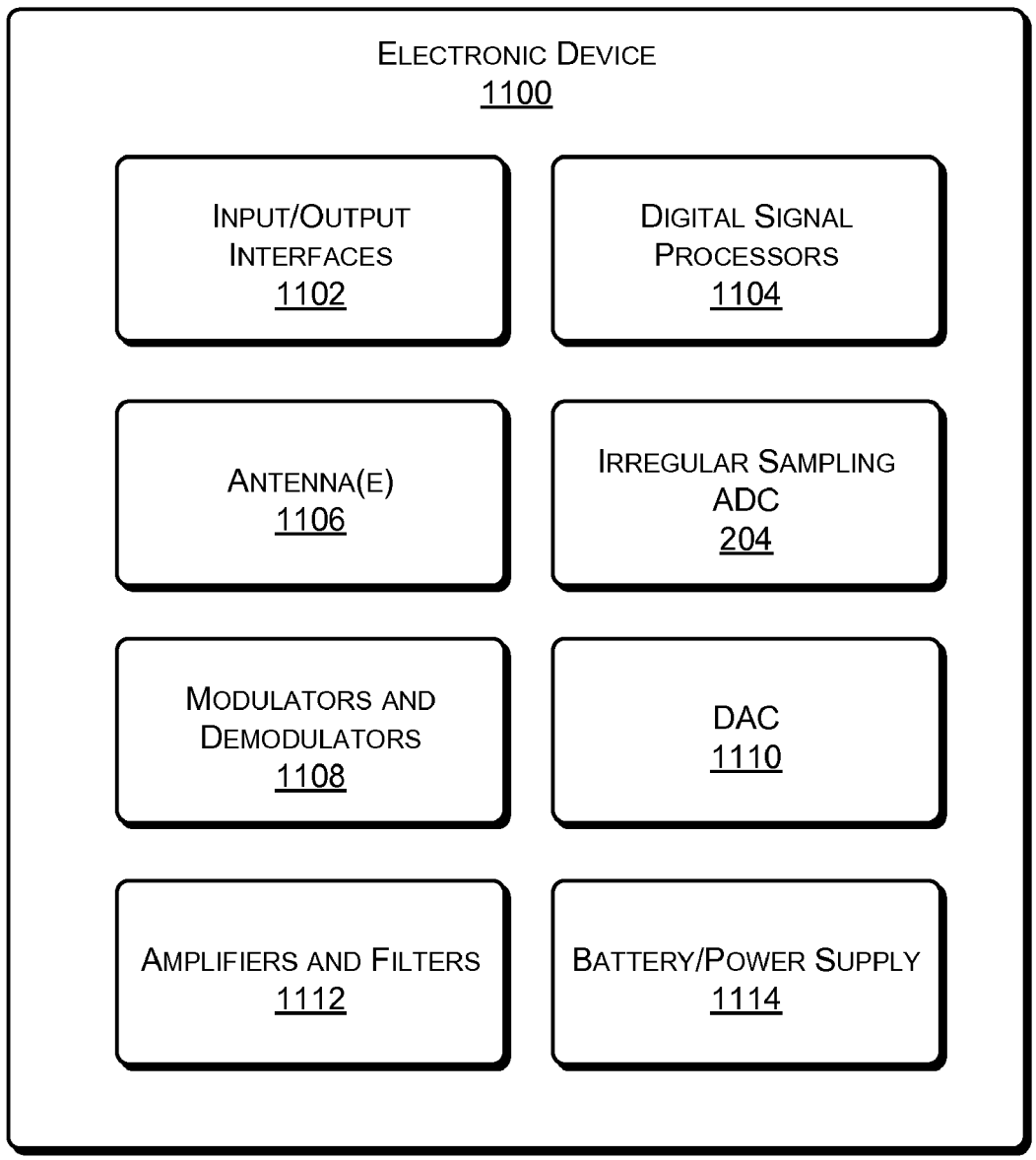
FIG. 11 illustrates an electronic device implementing an Analog to Digital Converter using irregular sampling.

FIG. 11 illustrates an embodiment of an electronic device 1100 implementing analog to digital conversion using irregular sampling. The electronic device 1100 can include one or more input/output interfaces 1102 and Digital Signal processor(s) DSP 1104. The electronic device 1100 can further include one or more antennae 1106 for transmitting and receiving radio frequency. The antennae 1106 may be configured to receive different radio frequencies (RF) in different bands. The antenna 1106 can include smart antennas, fractal antennas, microstrip antenna, and so on.

The one or more digital signal processors 1104 can perform control and command functions, including accessing and controlling the components of the electronic device 1100. Digital Signal Processor(s) 1104 can be a single processing unit or multiple computing units. Input/output interfaces 1102 can be used to connect input/output devices such as such as a microphone, a user screen, a user interface (e.g., keypad, touchpad, etc.), speakers, and so on to the electronic device 1100.

The electronic device 1100 includes an irregular sampling analog to digital converter (ADC) 204 that can convert input analog signals received via the input/output interfaces 1102 into a digital signal. The irregular sampling analog to digital converter 204 may include ADSM 302, TDC/Irregular Sampler 304 and DSP 306.

The analog signal can be first modulated to generate asynchronous square waves with varying pulse width and period in accordance with the amplitude of the analog signal. This modulated signal is then sampled to generate irregular samples. The sampled signal can be quantized before it is utilized to reconstruct the original signal sample by sample in digital form or a digital signal.

Modulators and demodulators 1108 can be included in the electronic device 1100 in order to up sample the digital signal or add a carrier wave to the digital signal for broadband transmission. In an implementation, a demodulator can demodulate the signal received via the antenna, and strip off the carried frequency to obtain the baseband digital signal.

The baseband digital signal can be converted into analog. Converting to analog may be performed using a Digital to Analog Converter 1110 or DAC 1110. Any suitable DAC 1110 can be used in the electronic device 1100. For example, Binary weighted DAC, over sampling DAC, pulse width modulating DAC, segmented DAC, and so on. The choice of the DAC 1110 can depend on the technology used, the frequency of the signal, the precision and accuracy demanded and so on.

Amplifiers and filters 1112 can also be present in the electronic device 1100 to amplify the signal and minimize the noise and distortion of the signal in the useful band. The amplifiers can be power amplifiers, operational amplifiers, and audio amplifiers and so on. The filters in the electronic device 1100 can include pre filters, noise shapers, digital filters, analog filters and so on. The electronic device 1100 also includes a battery or power supply 1114 that provides power to the electronic device.

CONCLUSION

Although the subject matter has been described in language specific to structural features and/or methodological acts, it is to be understood that the subject matter defined in the appended claims is not necessarily limited to the specific features or acts described. Rather, the specific features and acts are disclosed as exemplary forms of implementing the claims. For example, the systems described could be configured as wireless communication devices, computing devices, and other electronic devices.

What is claimed is:

1. A device comprising:
   a sample component of an analog-to-digital converter that receives a signal, the sample component concurrently samples the signal at irregular intervals that are based on a fluctuation in the signal and at regular intervals based on a clock signal for the device wherein power consumption of the analog-to-digital converter is reduced.

2. The device of claim 1, wherein the fluctuation in the signal includes a transition from a first state to a second state.

3. The device of claim 1, wherein the sample component outputs an output signal that represents an indication of a data edge of the signal.

4. The device of claim 1, further comprising:
   a modulating component that receives an analog signal, modulates the analog signal, and outputs the signal that is received by the sample component; and
   a processing component that receives an output signal from the sample component, demodulates the output signal, and outputs a digital signal that is representative of the analog signal.

5. The device of claim 1, wherein:
   the output signal is a first output signal based on the sampling at irregular intervals, and
   the sampling component provides a second output signal based on the sampling at regular intervals.

6. The device of claim 5, wherein the processing component receives the second output signal and demodulates the second output signal.

7. The device of claim 6, wherein the processing component outputs the digital signal based on the demodulated first output signal and the demodulated second output signal.

8. The device of claim 5, wherein the sample component comprises:
a first sampler that samples the signal at irregular intervals and provides the first output signal; and
a second sampler that samples the signal at regular intervals, receives the clock signal and provides the second output signal.

9. A device comprising:
a sample component of an analog-to-digital converter that receives an asynchronous square wave signal, the sample component samples the asynchronous square wave signal when a rising or falling edge of the asynchronous square wave signal is provided to the sample component wherein power consumption of the analog-to-digital converter is reduced.

10. The device of claim 9, wherein the asynchronous square wave signal is representative of an analog signal.

11. The device of claim 9, further comprising:
a modulating component that receives an analog signal, modulates the analog signal, and outputs the asynchronous square wave signal that is received by the sample component; and
a processing component that receives an output signal from the sample component, demodulates the output signal, and outputs a digital signal that is representative of the analog signal.

12. The device of claim 11, further comprising:
a digital to analog converter that receives the output signal and converts the output signal to a feedback signal; and
a filter component that receives an analog signal and the feedback signal and provides the analog signal to the modulating component.

13. The device of claim 12, wherein the sample component introduces noise into the output signal.

14. The device of claim 13, wherein the filter component band limits the analog signal and shapes the noise to a higher frequency.

15. The device of claim 9, wherein the sample component samples the asynchronous square wave signal at regular intervals based on a clock signal for the device concurrently with the sampling at the rising or falling edge of the asynchronous square wave signal.

16. The device of claim 15, wherein the sample component provides:
a first output signal based on the sampling at the rising or falling edge of the asynchronous square wave signal; and
a second output signal based on the sampling at regular intervals.

17. A method comprising:
sampling an asynchronous square wave signal via a sampling component of an analog-to-digital converter when a rising or falling edge of the asynchronous square wave signal is provided to the sampling component; and
sampling the asynchronous square wave signal via the sampling component at regular intervals concurrently with the sampling at the rising or falling edge of the asynchronous square wave signal wherein power consumption of the analog-to-digital converter is reduced.

18. The method of claim 17, further comprising:
providing a first output signal, from the sampling component, based on the sampling at the rising or falling edge of the asynchronous square wave signal, the asynchronous square wave signal being representative of an analog signal; and
providing a second output signal, from the sampling component, based on the sampling at the regular intervals.

19. The method of claim 18, further comprising:
generating a digital signal that is representative of the analog signal based at least in part on a demodulating of the first output signal and the second output signal.

* * * * *